(12) United States Patent
Chen et al.

(10) Patent No.: US 12,068,292 B2
(45) Date of Patent: Aug. 20, 2024

(54) LIGHT-EMITTING DIODE MICRO DISPLAY DEVICE

(71) Applicant: PlayNitride Display Co., Ltd., Zhunan Township, Miaoli County (TW)

(72) Inventors: Yen-Yeh Chen, Zhunan Township, Miaoli County (TW); Chih-Ling Wu, Zhunan Township, Miaoli County (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 394 days.

(21) Appl. No.: 17/495,210

(22) Filed: Oct. 6, 2021

(65) Prior Publication Data

US 2022/0375904 A1 Nov. 24, 2022

(30) Foreign Application Priority Data

May 20, 2021 (TW) ................................ 110118206

(51) Int. Cl.
*H01L 25/075* (2006.01)
*H01L 33/50* (2010.01)
(Continued)

(52) U.S. Cl.
CPC .......... *H01L 25/0753* (2013.01); *H01L 33/50* (2013.01); *H01L 33/58* (2013.01); *H01L 33/62* (2013.01)

(58) Field of Classification Search
CPC ............................ H01L 25/0753; H01L 33/50
See application file for complete search history.

(56) References Cited

U.S. PATENT DOCUMENTS

2017/0309678 A1 10/2017 Yang et al.
2019/0115333 A1* 4/2019 Wu .......................... H01L 33/54
(Continued)

FOREIGN PATENT DOCUMENTS

CN 110010752 A 7/2019
CN 110707119 A 1/2020
(Continued)

*Primary Examiner* — Jay C Chang
*Assistant Examiner* — Mikka Liu
(74) *Attorney, Agent, or Firm* — MUNCY, GEISSLER, OLDS & LOWE, P.C.

(57) ABSTRACT

An LED micro display device includes a circuit substrate, micro light-emitting elements, an insulating layer, and a common electrode layer. The circuit substrate has conductive patterns. The micro light-emitting elements are bonded to the circuit substrate and disposed corresponding to the conductive patterns. Each micro light-emitting element has a bottom surface, a top surface and a side wall. The bottom surface connects to the corresponding conductive pattern. The side wall has a first sidewall portion adjacent to the circuit substrate and a second sidewall portion connected to the first sidewall portion. The insulating layer is disposed on the circuit substrate, covers first sidewall portions, and exposes second sidewall portions. The common electrode layer covers the insulating layer and second sidewall portions. The common electrode layer is electrically connected to the micro light-emitting elements, contacts the second sidewall portions, and exposes the top surfaces.

20 Claims, 11 Drawing Sheets

(51) Int. Cl.
    *H01L 33/58*        (2010.01)
    *H01L 33/62*        (2010.01)

(56)         References Cited

U.S. PATENT DOCUMENTS

2019/0355786  A1    11/2019  Iguchi
2020/0258869  A1     8/2020  Wu et al.
2021/0050495  A1     2/2021  Yang et al.
2022/0352246  A1 *  11/2022  Choi ................... H01L 25/0753

FOREIGN PATENT DOCUMENTS

CN          110957342 A     4/2020
CN          111201620 A     5/2020
CN          111580269 A     8/2020
TW          201916342 A     4/2019
TW             I715155 B    1/2021

* cited by examiner

LIGHT-EMITTING DIODE MICRO DISPLAY DEVICE

CROSS REFERENCE TO RELATED APPLICATIONS

This Non-provisional application claims priority under 35 U.S.C. § 119(a) on Patent Application No(s). 110118206 filed in Taiwan, Republic of China on May 20, 2021, the entire contents of which are hereby incorporated by reference.

BACKGROUND

Technology Field

The present disclosure relates to a display device and, in particular, to a light-emitting diode micro display device.

Description of Related Art

When the world is paying attention to the future display technology, micro light emitting diode (Micro LED) is one of the most promising technologies. In brief, Micro LED is a technology of miniaturizing and matrixing LEDs to dispose millions or even tens of millions of dies smaller than 100 microns and thinner than a hair on a substrate. Compared with the current OLED (organic light-emitting diode) display technology, Micro LED is also a self-luminous device but utilizes different material. Therefore, Micro LED can solve the screen burn-in issue, which is the most deadly problem in OLED display. Besides, Micro LED further has the advantages of low power consumption, high contrast, wide color gamut, high brightness, small and thin size, light weight and energy saving. Therefore, major factories around the world are scrambling to invest in the research and development of Micro LED technology.

In the conventional manufacturing process of the light-emitting diode (LED) micro display device, the circuit substrate and the micro light-emitting element substrate are individually manufactured, and then the two substrates are aligned and assembled. However, the assembling accuracy may not meet the requirements of high-resolution (high PPI, such as UHD or AR/VR) display devices, resulting in a low process yield. In addition, in another conventional manufacturing process, the mass transfer technology plays a very important role, which is to transfer a huge amount of micro LED elements that are pre-fabricated and placed on a temporary substrate to the circuit substrate of the application device (e.g. a display device). Considering the transfer accuracy of the current mass transfer technology, however, there is still a problem of production yield when the mass transfer technology is applied to the production of high-resolution display devices.

Even if the micro light-emitting elements are directly manufactured on the circuit substrate of the display device instead of utilizing the above two manufacturing techniques, the formed micro LED elements still have the problem of poor luminous efficiency.

SUMMARY

One or more exemplary embodiments of this disclosure are to provide a light-emitting diode (LED) micro display device having good luminous efficiency.

In an exemplary embodiment, an LED micro display device of the disclosure comprises a circuit substrate, a plurality of micro light-emitting elements, an insulating layer, and a common electrode layer. The circuit substrate has a plurality of conductive patterns. The micro light-emitting elements are bonded to the circuit substrate and disposed corresponding to the conductive patterns. Each micro light-emitting element has a bottom surface, a top surface and a side wall connected to the bottom surface and the top surface. The bottom surface connects to the corresponding conductive pattern. The side wall has a first sidewall portion and a second sidewall portion connected to the first sidewall portion, and the first sidewall portion is disposed adjacent to the circuit substrate, while the second sidewall portion is disposed away from the circuit substrate. The insulating layer is disposed on the circuit substrate, covers the first sidewall portions, and exposes the second sidewall portions. The common electrode layer is disposed on the circuit substrate and covers the insulating layer and the second sidewall portions of the plurality of micro light-emitting elements. The common electrode layer is electrically connected to the micro light-emitting elements. The common electrode layer contacts the second sidewall portions and exposes the top surface of each micro light-emitting element.

In one embodiment, the aspect ratio of the micro light-emitting element is greater than or equal to 0.5 and less than or equal to 2.5.

In one embodiment, the micro light-emitting element comprises a first type semiconductor layer, a light-emitting layer and a second type semiconductor layer stacked in order, and the first type semiconductor layer is adjacent to the circuit substrate and electrically connected to the corresponding conductive pattern.

In one embodiment, the insulating layer cover a side surface of the light-emitting layer and a side surface of the first type semiconductor layer.

In one embodiment, the LED micro display device further comprises a plurality of bonding electrodes and a plurality of conductive members. The bonding electrodes are individually disposed on the bottom surfaces of the corresponding micro light-emitting elements, respectively. The conductive members are respectively disposed between the corresponding bonding electrodes and the corresponding conductive patterns. Each micro light-emitting element is bonded on the circuit substrate via the corresponding bonding electrode and the corresponding conductive member, and electrically connected to the corresponding conductive pattern.

In one embodiment, the width of each conductive member is greater than the corresponding conductive pattern, and is less than or equal to the width of the corresponding micro light-emitting element.

In one embodiment, the bonding electrode is arranged on the bottom surface of the micro light-emitting element in an indentation manner.

In one embodiment, the bonding electrode comprises a metal layer, a transparent conductive layer, or a combination thereof.

In one embodiment, the insulating layer comprises a first insulating layer, a second insulating layer and a third insulating layer overlapped with each other, the first insulating layer is disposed between the conductive members, the second insulating layer is disposed between the first insulating layer and the third insulating layer, and the third insulating layer is disposed between the sidewall portion and the common electrode layer.

In one embodiment, the LED micro display device further comprises a planarization layer and a light conversion layer. The planarization layer is disposed on the common electrode layer, and the planarization layer, the common electrode layer, and the top surfaces of the micro light-emitting elements together define a plurality of recesses. The light conversion layer is disposed in at least a part of the recesses.

In one embodiment, the LED micro display device further comprises a protection layer disposed on the planarization layer and the light conversion layer.

In one embodiment, the protection layer is filled into at least a part of the recesses.

In one embodiment, the light conversion layer comprises a light conversion material and a light filter material.

In one embodiment, the LED micro display device further comprises a light permeable layer disposed on the protection layer.

In one embodiment, the light permeable layer comprises a light concentration structure or an adhesion material.

In one embodiment, the light permeable layer comprises a plurality of light concentration structures, and the light concentration structures are arranged corresponding to a plurality of pixels, respectively.

In one embodiment, the light permeable layer comprises a plurality of light concentration structures, and the light concentration structures are arranged corresponding to the micro light-emitting elements, respectively.

As mentioned above, in the LED micro display device of this disclosure, the micro light-emitting elements are disposed corresponding to the conductive patterns of the circuit substrate, the insulating layer covers the first sidewall portions of the micro light-emitting elements, and the common electrode layer is electrically connected to the micro light-emitting elements and contacts the second sidewall portions of the micro light-emitting elements with exposing the top surfaces of the micro light-emitting elements. Accordingly, the light emitted through the top surface of the micro light-emitting element is not blocked or absorbed by the common electrode layer. As a result, the LED micro display device of this disclosure can have a good luminous efficiency for meeting the requirement of high-resolution display devices.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
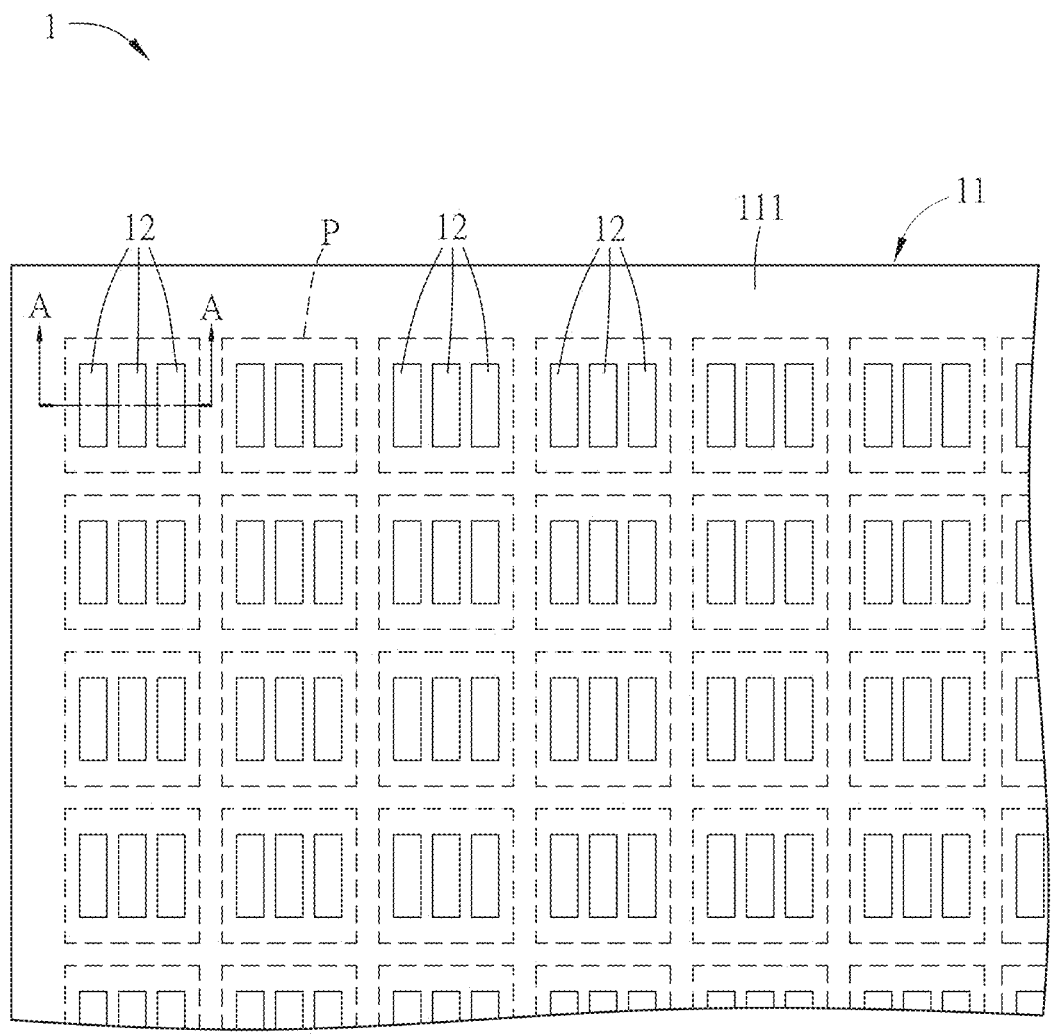
FIG. 1A is a schematic diagram showing an LED micro display device according to an embodiment of this disclosure.
Figure 1B:
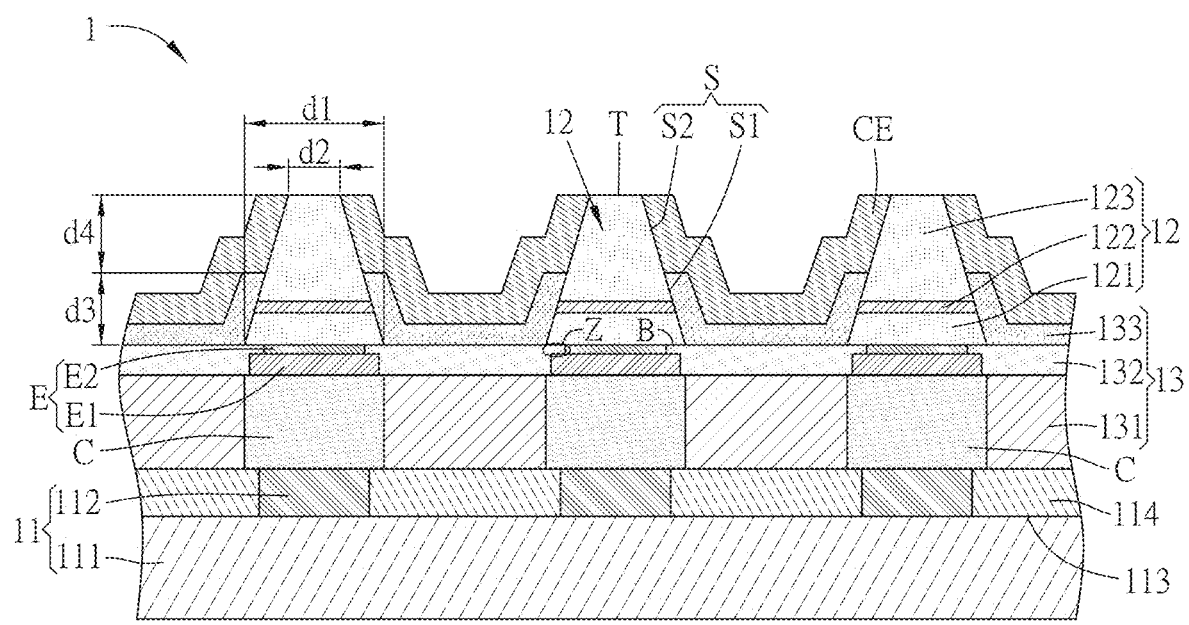
FIG. 1B is a sectional view of the LED micro display device of FIG. 1A along the line A-A.

FIG. 1A is a schematic diagram showing an LED micro display device according to an embodiment of this disclosure, and FIG. 1B is a sectional view of the LED micro display device of FIG. 1A along the line A-A. To be noted, FIG. 1A shows that the LED micro display device 1 includes a plurality of pixels P, and the pixels P are arranged in a matrix of rows and columns. In this embodiment, each pixel P includes three sub-pixels arranged side by side, and each sub-pixel includes one micro light-emitting element 12. That is, each pixel P includes three micro light-emitting elements 12 arranged side by side. In other embodiments, the arrangement of the three sub-pixels of the pixel P can be different. For example, two of the three sub-pixels are arranged vertically (up and down), and the third sub-pixel is arranged next to the other two sub-pixels laterally. Of course, other arrangements of the three sub-pixels are acceptable. In other embodiments, each pixel P may include, for example, four or more sub-pixels. If the pixel P includes four sub-pixels, for example, the four sub-pixels can be arranged side by side in a row or a column, arranged in a 2*2 matrix, or any of other arrangements, and this disclosure is not limited.

Referring to FIGS. 1A and 1B, the LED micro display device 1 of this embodiment may be an AM (Active Matrix) or PM (Passive Matrix) LED micro display device, and may comprise a circuit substrate 11, a plurality of micro light-emitting elements 12, an insulating layer 13 and a common electrode layer CE. In addition, the LED micro display device 1 of this embodiment may further include a plurality of bonding electrodes E and a plurality of conductive members C.

The circuit substrate 11 comprises a substrate 111, a plurality of conductive patterns 112, and a circuit layer (not shown). The conductive patterns 112 are separately arranged on a surface 113 of the substrate 111, and each conductive pattern 112 is electrically connected to the corresponding circuit layer. A dielectric layer 114 is configured between the conductive patterns 112 for isolating the conductive patterns 112. The circuit substrate 11 can transmit independently controlled electrical signals to the corresponding conductive patterns 112 through the circuit layer (including but not limited to transfer circuits and transistor components). In some embodiments, the circuit substrate 11 may be, for example, a Complementary Metal-Oxide-Semiconductor (CMOS) substrate, a Liquid Crystal on Silicon (LCOS) substrate, or a thin film transistor (TFT) substrate, or any of other circuit substrate 11 with working circuits, to drive the micro light-emitting elements 12. In some embodiments, the length of the circuit substrate 11 can be, for example but not limited to, less than or equal to 1 inch, and the PPI (pixels per inch) thereof can be greater than 1000. Of course, in other embodiments, the length of the circuit substrate 11 can be greater than 1 inch, and the PPI thereof is not limited.

A plurality of micro light-emitting elements 12 are disposed on the circuit substrate 11, and are disposed corresponding to the conductive patterns 112, respectively. In this embodiment, one micro light-emitting element 12 corresponds to one conductive pattern 112. Each micro light-emitting element 12 has a bottom surface B, a top surface T, and a side wall S connected to the bottom surface B and the top surface T. The bottom surface B faces the circuit substrate 11 and is connected to the corresponding conductive pattern 112. The top surface T is opposite to the bottom surface B and is located at a side of the micro light-emitting element 12 away from the circuit substrate 11. The side wall S has a first sidewall portion S1 and a second sidewall portion S2 connected to the first sidewall portion S1. The first sidewall portion S1 is disposed adjacent to the circuit substrate 11, and the second sidewall portion S2 is disposed away from the circuit substrate 11.

In this embodiment, the micro light-emitting element 12 is a micro LED made of inorganic materials. As shown in FIG. 1B, in a cross-sectional direction of the micro light-emitting element 12, d1 indicates the width of the bottom surface B of the micro light-emitting element 12, d2 indicates the width of the top surface T of the micro light-emitting element 12, and d3 indicates the width of the height of the first sidewall portion S1 of the micro light-emitting element 12, and d4 indicates the height of the second sidewall portion S2 of the micro light-emitting element 12 (the sum of d3 and d4 is the height of the micro light-emitting element 12). In some embodiments, the width d1 can be between 0.05 µm and 10 µm, the width d2 can be greater than 0.01 µm and less than the width d1, the height d3 can be between 0.5 µm and 2 µm, and the height d4 can be between 0.1 µm and 4 µm. In summary, in some embodiments, the aspect ratio (the ratio of height to width) of the micro light-emitting element 12 can be greater than or equal to 0.4 and less than or equal to 30, and, preferably, the aspect ratio of the micro light-emitting element 12 in this disclosure is greater than or equal to 0.5 and less than or equal to 2.5. In practice, the distance between any two adjacent micro light-emitting elements 12 is substantially less than 1.5 times of the width d1 (1.5×d1). In this embodiment, the distance between any two adjacent micro light-emitting elements 12 is less than or equal to the width d1. If the aspect ratio is less than 0.4, it means that the micro light-emitting element has a large size and is not suitable for high-resolution micro display panels. If the aspect ratio is greater than 30, it means that the micro light-emitting element has a slim shape and is not suitable for the manufacturing process of this disclosure. It should be noted that the "height" mentioned in this disclosure refers to the height in the direction perpendicular to the surface 113 of the circuit substrate 11 (e.g., d3, d4, or d3+d4), and the "width" refers to the width in the direction parallel to the surface 113 of the circuit substrate 11 (e.g., d1 or d2).

The micro light-emitting element 12 includes a first type semiconductor layer 121, a light-emitting layer 122, and a second type semiconductor layer 123, which are stacked in order. The first type semiconductor layer 121 is electrically connected to the corresponding conductive pattern 112, and the light-emitting layer 122 is sandwiched between the first type semiconductor layer 121 and the second type semiconductor layer 123. In this embodiment, the thickness of the first type semiconductor layer 121 is smaller than the thickness of the second type semiconductor layer 123, so that the light-emitting layer 122 is closer to the circuit substrate 11. The first type semiconductor layer 121 of this embodiment is, for example, a P-type semiconductor, the second type semiconductor layer 123 is, for example, an N-type semiconductor, and the light-emitting layer 122 can be, for example, a multiple quantum well (MQW) layer. To be noted, this disclosure is not limited thereto. In different embodiments, the first type semiconductor layer 121 can be an N-type semiconductor, and the second type semiconductor layer 123 can be a P-type semiconductor.

Each bonding electrode E is respectively disposed between the corresponding conductive pattern 112 and the bottom surface B of the corresponding micro light-emitting element 12. In this embodiment, the bonding electrode E is connected to the bottom surface B of the micro light-emitting element 12, and each conductive member C is respectively disposed between the corresponding bonding electrode E and the corresponding conductive pattern 112. Accordingly, the micro light-emitting element 12 can be bonded to the circuit substrate 11 via the corresponding bonding electrode E and the corresponding conductive pattern 112 and is electrically connected to the corresponding conductive pattern 112. Therefore, in this embodiment, the conductive member C is configured to connect the bonding electrode E (including the transparent conductive layer E2 and the metal layer E1) to the corresponding conductive pattern 112, so that (the bottom surface B of) the micro light-emitting element 12 can be connected to the corresponding conductive pattern 112 via the conductive member C.

The bonding electrode E of this embodiment is arranged on the bottom surface B of the micro light-emitting element 12 in an indentation manner. In other words, the width of the bonding electrode E is less than the width of the bottom surface B, so that the bonding electrode E can be completely shielded by the bottom surface B of the micro light-emitting element 12 when viewing from the side of the micro light-emitting element 12 away from the circuit substrate 11 toward the circuit substrate 11 (i.e., viewing from the top side of the micro light-emitting element 12 as shown in FIG. 1B). In addition, the width of the conductive member C is greater than the width of the corresponding conductive pattern 112 and is less than or equal to the width of the corresponding micro light-emitting element 12. In this embodiment, the width of the conductive member C is greater than the width of the corresponding conductive pattern 112 and equal to the width of the corresponding micro light-emitting element 12 as an example. Since the width of the conductive element C is not greater than (less than or equal to) the micro light-emitting element 12, the etching solution will not damage the conductive element C during the etching process.

The bonding electrode E may include a metal layer E1, a transparent conductive layer E2, or a combination thereof. In this embodiment, the bonding electrode E includes, for example, a metal layer E1 and a transparent conductive layer E2, which are overlapped, and the transparent conductive layer E2 is located between the metal layer E1 and the bottom surface B. The material of the metal layer E1 may comprise metal (e.g., aluminum, copper, silver, molybdenum, or titanium) or an alloy thereof, and the material of the transparent conductive layer E2 may comprise, for example, indium tin oxide (ITO), indium zinc oxide (IZO), Aluminum zinc oxide (AZO), cadmium tin oxide (CTO), tin oxide ($SnO_2$), zinc oxide (ZnO), or any of other transparent conductive materials. The material of the conductive member C can include, for example but not limited to, tin, copper, silver, gold, or an alloy of any combination of the above-mentioned metals (e.g., copper plus a metal other than tin), and this disclosure is not limited.

Figure 3A:
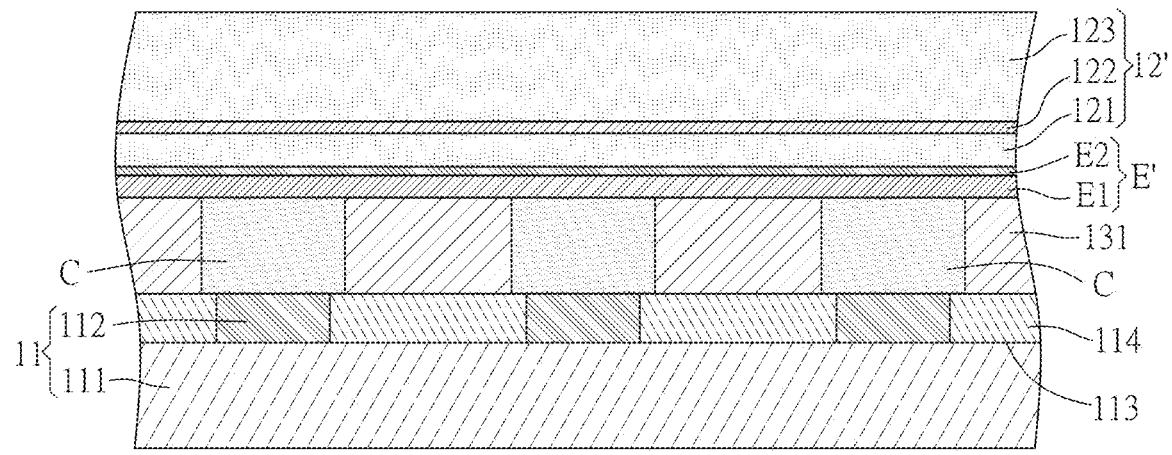
FIGS. 3A and 3B are schematic diagrams showing the manufacturing procedure of an LED micro display device according to an embodiment of this disclosure.
Figure 3B:
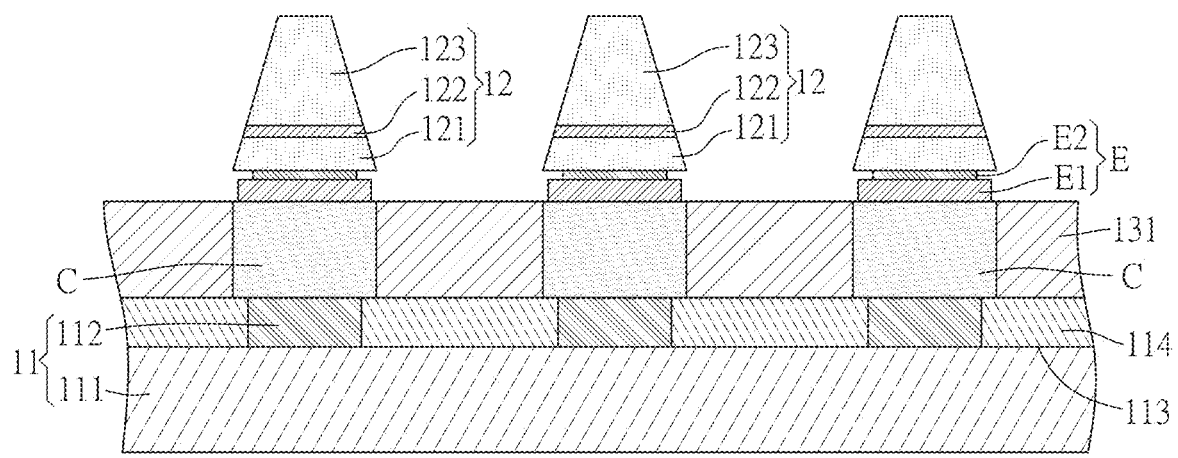

In more detail, referring to FIG. 3A and FIG. 3B, in order to manufacture the LED micro display device 1 of this embodiment, the first step is to form a high-quality semiconductor epitaxial layer (the layer 12' as shown in FIG. 3A) and an bonding electrode layer (the layer E' as shown in FIG. 3A) on an epitaxial substrate (such as a sapphire substrate or a GaAs substrate, not shown). Next, the entire film layers that have not been chip-processed by the die patterning are reversed and then connected to the circuit substrate 11 via the conductive members C. After the epitaxial substrate is removed, the patterning process of pixelized chip and bonding electrode is performed (i.e., the pattering process including lithography, etching and the likes). As shown in FIG. 3A, the micro light-emitting elements 12 and the bonding electrodes E that are separated from each other can be formed. Since the epitaxial substrate with the semiconductor epitaxial layer 12' and the bonding electrode layer E' is still a whole film layer when bonded to the circuit substrate 11, it can avoid the chip missing and improve the process window of alignment accuracy in a mass-transferring process. Thereby, it is able to prevent the problem of short circuit between the micro chips, and increase the display yield.

Referring to FIG. 1B, the insulating layer 13 is disposed on the circuit substrate 11 and covers the first sidewall portion S1. Specifically, the insulating layer 13 can cover all surfaces of the first sidewall portions S1 of the micro light-emitting elements 12, and the insulating layer 13 needs to cover the side surface of the light-emitting layer 122. In detail, the height of the insulating layer 13 covering the first sidewall portion S1 of the micro light-emitting element 12 (i.e., the distance from the highest point of the insulating layer 13 to the surface 113 of the circuit substrate 11) should exceed the height of the light-emitting layer 122 (i.e., the distance from the highest point of the light-emitting layer 122 to the surface 113 of the circuit substrate 11) to prevent the contact between the sequential common electrode layer CE and the light-emitting layer 122, which may cause a short circuit therebetween. In detail, the first sidewall portion S1 includes the side surface of the first type semiconductor layer 121, the side surface of the light-emitting layer 122, and a part of the side surface of the second type semiconductor layer 123, while the second sidewall portion S2 includes the residual part of the side surface of the second type semiconductor layer 123.

The insulating layer 13 of this embodiment comprises a first insulating layer 131, a second insulating layer 132 and a third insulating layer 133, which are sequentially overlapped and disposed on the surface 113 of the circuit substrate 11. The first insulating layer 131 is disposed between the conductive members C. The second insulating layer 132 is disposed between the first insulating layer 131 and the third insulating layer 133. The third insulating layer 133 covers the second insulating layer 132. Furthermore, the third insulating layer 133 is arranged between the first sidewall portion S1 of the micro light-emitting element 12 and the common electrode layer CE, and contacts the first sidewall portion S1 of the micro light-emitting element 12 and the common electrode layer CE. The first insulating layer 131 can prevent the short circuit between the conductive members C. In addition, a part of the second insulating layer 132 may be located between the bottom surface B of the micro light-emitting element 12 and the bonding electrode E for filling the gap caused by the etching process. That is, a part of the second insulating layer 132 can fill the area Z defined between the metal layer E1, the transparent conductive layer E2, and the bottom surface B (as shown in FIG. 1B). In different embodiments, the insulating layer 13 may exclude the second insulating layer 132, and a part of the first insulating layer 131 or the third insulating layer 133 fills the gap between the bottom surface B of the micro light-emitting element 12 and the bonding electrode E (the area Z).

The first insulating layer 131 can be made of an organic material (e.g., a structural photoresist). The second insulating layer 132 can be made of an organic material (e.g., a structural photoresist) or an inorganic material (e.g., silicon dioxide or silicon nitride), and the material of the second insulating layer 132 can be the same as or different from the material of the first insulating layer 131. The third insulating layer 133 can be made of an inorganic material (e.g., silicon dioxide or silicon nitride). In some embodiments, the thickness of the first insulating layer 131 can be between 1 μm and 4 μm, the thickness of the second insulating layer 132 can be between 0.05 μm and 3 μm, and the thickness of the third insulating layer 133 can be between 5 nm and 600 nm.

The common electrode layer CE is disposed on the circuit substrate 11 and covers the insulating layer 13, and the common electrode layer CE is electrically connected to the micro light-emitting elements 12. In this embodiment, the common electrode layer CE contacts the second sidewall portion S2 of the micro light-emitting element 12 and exposes the top surface T of each micro light-emitting element 12. The common electrode layer CE of this embodiment respectively covers (contacts) the second sidewall portion S2 of each micro light-emitting element 12 (i.e., contacts the second type semiconductor layer 123), and is electrically connected to the micro light-emitting element 12. Accordingly, the common electrode layer CE can provide a common electrode for the micro light-emitting elements 12 while respectively exposing the top surface T of each micro light-emitting element 12. The common electrode layer CE can be a transparent conductive layer, a metal layer, or a combination thereof, and this disclosure is not limited. The transparent conductive layer can be made of any of the above-mentioned transparent conductive materials, and the material of the metal layer can be any of the above-mentioned metals or their alloys. In some embodiments, the thickness of the common electrode layer CE can be between 0.1 μm and 3 μm.

Accordingly, in the LED micro display device 1, a micro LED in a pixel formed by a part of the common electrode layer CE, the micro light-emitting element 12 and the bonding electrode E is, for example, a vertical type micro LED. When the LED micro display device 1 is enabled, for example, the bonding electrode E can have a high potential, and the common electrode layer CE can have a ground potential or a low potential. The current generated by the potential difference between the bonding electrode E and the common electrode layer CE can enable the corresponding micro light-emitting element 12 to emit a (visible) light beam upwardly. More specifically, the LED micro display device 1 can be controlled by a driving element (e.g., an active element such as TFT) of the circuit substrate 11, and the corresponding bonding electrodes E can be applied with different high potentials through the conductive patterns 112, thereby driving the micro light-emitting elements 12 to emit light beams of different intensities corresponding to their respective driving currents. The spatial distribution of these light beams with different light intensities can form an image that can be seen by viewers. In some embodiments, the micro light-emitting element 12 can emit, for example, blue, green or white light, so that the LED micro display device 1 is functioned as a monochromatic display device.

As mentioned above, in the LED micro display device 1 of this embodiment, the micro light-emitting element 12 is configured corresponding to the conductive pattern 112 of the circuit substrate 11, the insulating layer 13 covers the first sidewall portion S1 of the micro light-emitting element 12, and the common electrode layer CE is electrically connected to the micro light-emitting element 12 and contacts the second sidewall portion S2 of the micro light-emitting element 12 with exposing the top surface T of the micro light-emitting element 12, so that the light emitted from the top surface T of the micro light-emitting element 12 will not be blocked (shielded) or absorbed by the common electrode layer CE. Therefore, the LED micro display device 1 of this embodiment can have higher luminous efficiency and can meet the requirements of high-resolution display devices.

FIGS. 2A to 2H are schematic diagrams showing the LED micro display devices of different embodiments of this disclosure. Herein, each of FIGS. 2A, 2B, 2G and 2H shows two pixels of a LED micro display device.

Figure 2A:
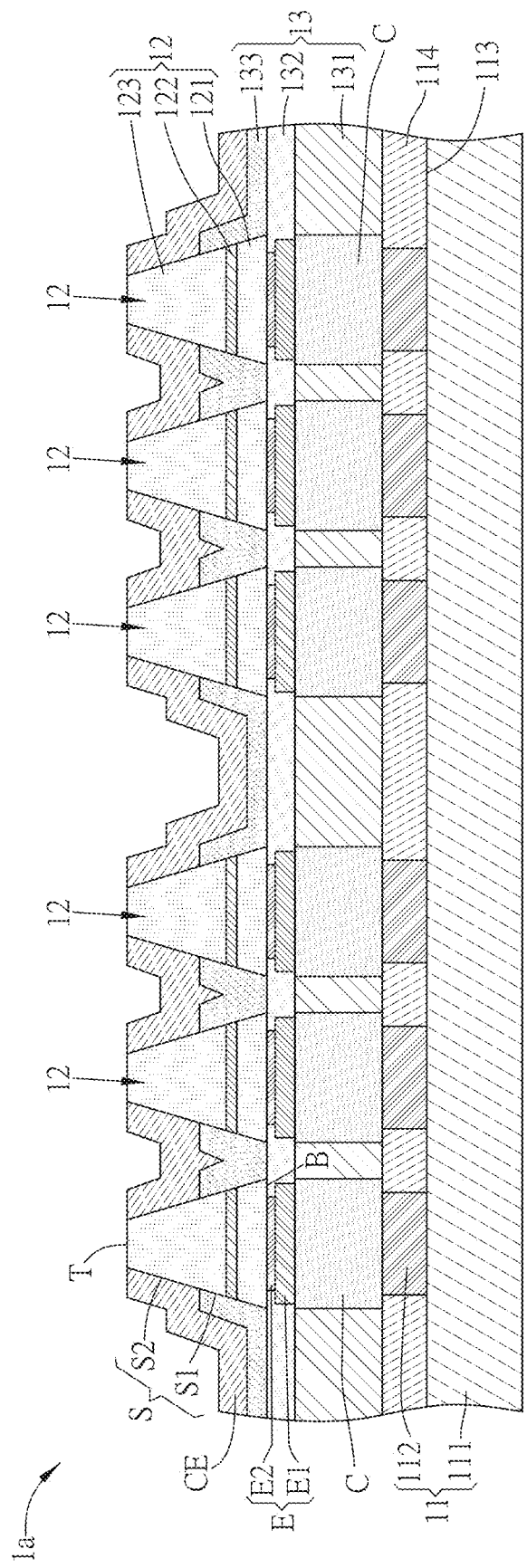
FIGS. 2A to 2H are schematic diagrams showing the LED micro display devices of different embodiments of this disclosure.

As shown in FIG. 2A, the configurations and connections of the components in the LED micro display device 1a of this embodiment are mostly the same as those of the LED micro display device 1 of the previous embodiment. Unlike the previous embodiment, the interval between two adjacent micro light-emitting elements 12 of the LED micro display device 1a of this embodiment is smaller than that of the LED micro display device 1, so that the PPI of the LED micro display device 1a is higher than that of the LED micro display device 1. Compared with the LED micro display device 1 of FIG. 1B, in the LED micro display device 1a of FIG. 2A (with higher PPI), the sink region of the common electrode layer E and the third insulating layer 133 located between two adjacent micro light-emitting elements 12 is smaller. In other words, the thickness of a part of the third insulating layer 133 located between the LEDs 12 of the same pixel is greater than the thickness of a part of the third insulating layer 133 located between two adjacent LEDs 12 of two adjacent pixels.

Figure 2B:
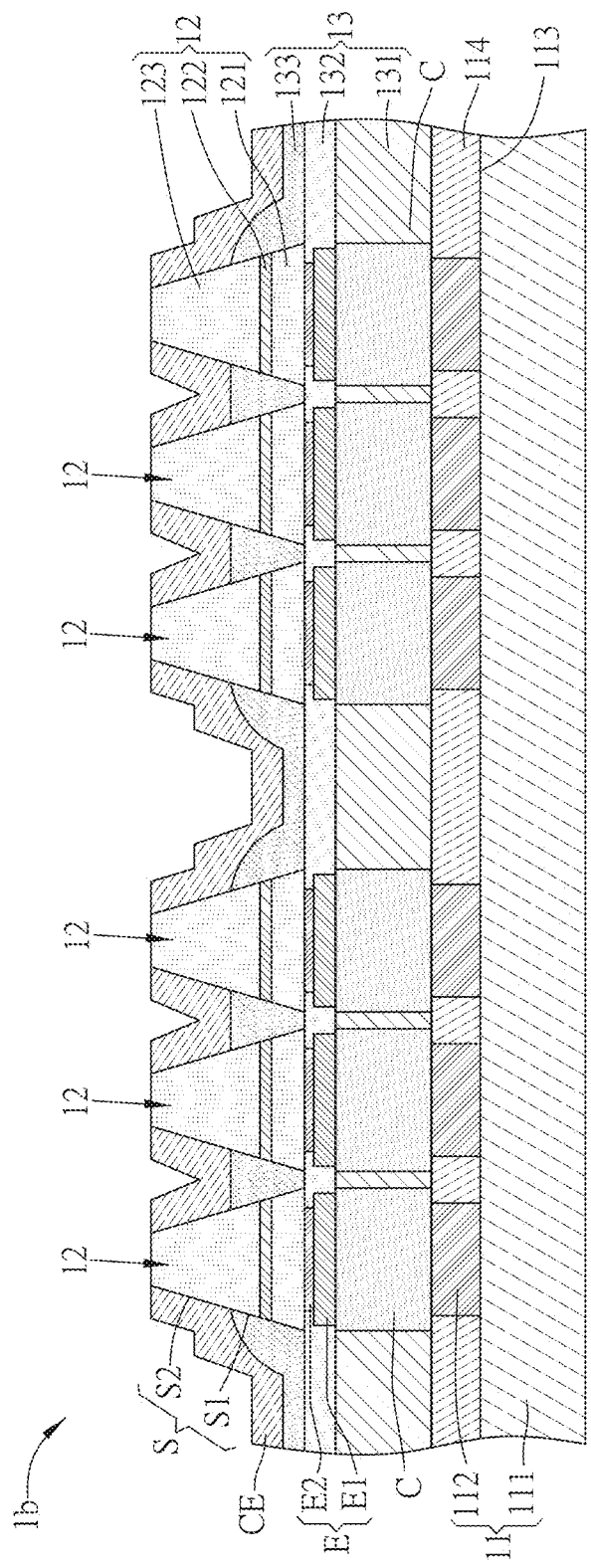

As shown in FIG. 2B, the configurations and connections of the components in the LED micro display device 1b of this embodiment are mostly the same as those of the LED micro display device 1a of the previous embodiment.

Unlike the previous embodiment, the interval between two adjacent micro light-emitting elements 12 of the LED micro display device 1b of this embodiment is much smaller than that of the LED micro display device 1a of FIG. 2A, so that the PPI of the LED micro display device 1b is higher than that of the LED micro display device 1a or 1. Compared with the LED micro display device 1a of FIG. 2A, in the LED micro display device 1b of FIG. 2B (with much higher PPI), the part of the third insulating layer 133 between two adjacent micro light-emitting elements 12 has a planar structure. In addition, as shown in FIG. 2B, the part of the third insulating layer 133 between two adjacent pixels contains round surfaces. The configuration of the round surfaces allows to smoothly form the common electrode layer CE on the third insulating layer 133 and the second sidewall portion S2.

Figure 2C:
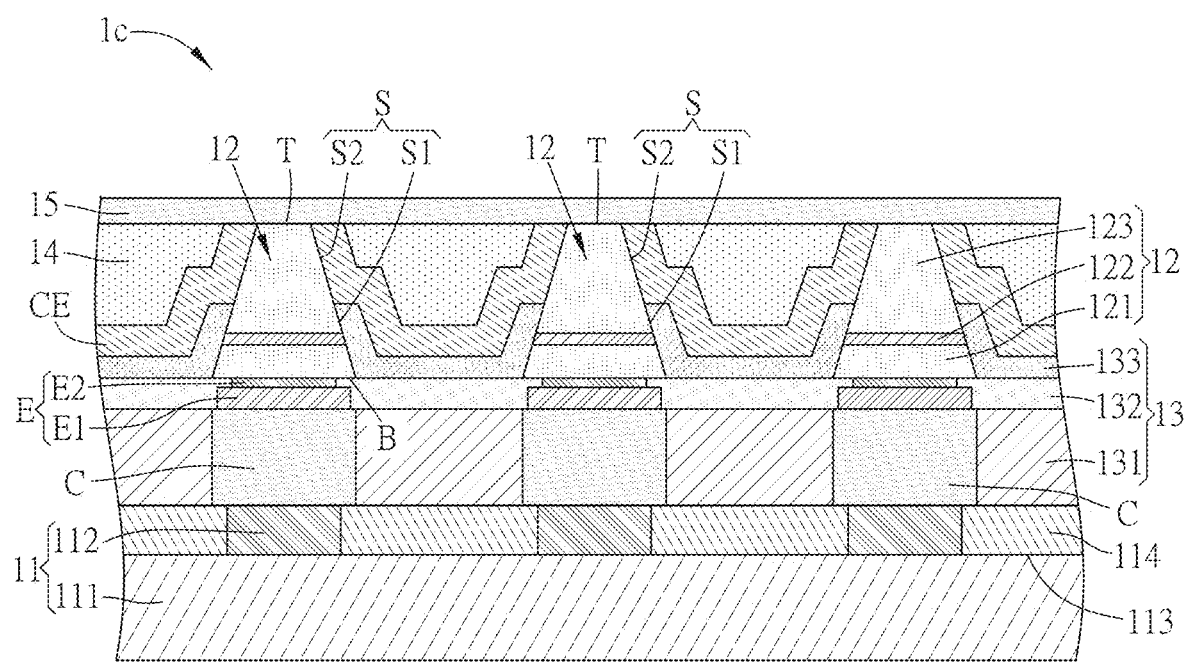

As shown in FIG. 2C, the configurations and connections of the components in the LED micro display device 1c of this embodiment are mostly the same as those of the LED micro display device 1 of the above-mentioned embodiment. Unlike the above-mentioned embodiment, the LED micro display device 1c of this embodiment further comprises a planarization layer 14 and a protection layer 15. The planarization layer 14 is disposed on the common electrode layer CE, and the protection layer 15 is disposed on the planarization layer and covers the top surfaces T of the micro light-emitting elements 12. The planarization layer 14 can be made of a black insulating material or any of other light-absorption material, which can be an organic material such as, for example, black photoresist, benzo cyclobutene (BCB), polyimide (PI), or organic adhesion. The protection layer 15 is configured to protect the micro light-emitting elements 12 from the damage of environmental moisture or dusts, and the material of the protection layer 15 comprises inorganic material, organic material, other suitable materials, or a combination thereof. The inorganic material can be, for example, silicon oxide, silicon nitride, silicon oxynitride, any of other suitable materials, or a stacked layer of at least two of the foregoing materials. In some embodiments, the thickness of the protection layer 15 can be between 0.05 μm and 5 μm, for example.

Figure 2D:
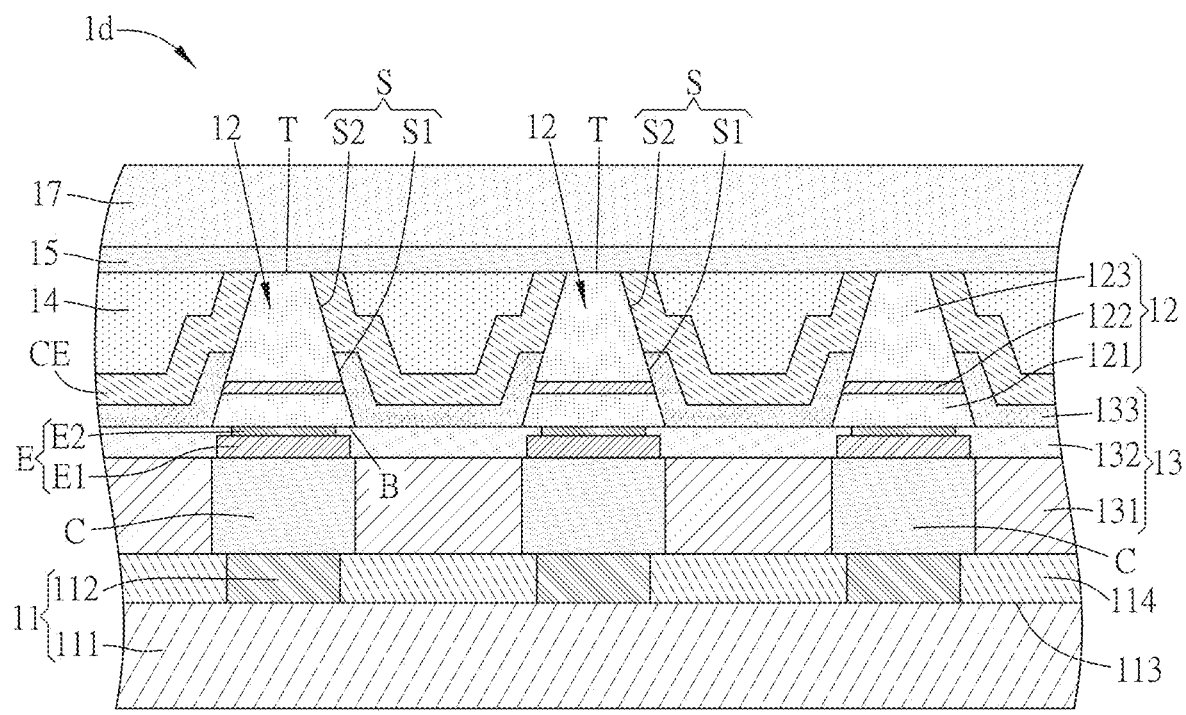

As shown in FIG. 2D, the configurations and connections of the components in the LED micro display device 1d of this embodiment are mostly the same as those of the LED micro display device 1c of the previous embodiment. Unlike the previous embodiment, the LED micro display device 1d of this embodiment further comprises a light permeable layer 17. The light permeable layer 17 is disposed on and covers the protection layer 15. In this embodiment, the light permeable layer 17 comprises an adhesion material, such as an optical clear adhesive (OCA) or an optical clear resin (OCR), for protecting the micro light-emitting elements 12 from the damage of the environmental moisture or dusts.

In particular, the light permeable layer 17 can also comprise a light concentration structure in addition to a layer formed of an adhesion material. Referring to FIG. 2G, in the LED micro display device 1g, the light permeable layer 17 includes a plurality of light concentration structures 171. The light concentration structures 171 are arranged correspondingly to the micro light-emitting elements 12, respectively. The light concentration structure 171 can be, for example, a micro lens for concentrating light and thus enhancing the brightness of the micro light-emitting element 12. In the LED micro display device 1g of FIG. 2G, each light concentration structure 171 is arranged corresponding to one pixel (including three micro light-emitting elements 12). In another embodiment, such as the LED micro display device 1h as shown in FIG. 2H, each light concentration structure 171 is arranged corresponding to one micro light-emitting element 12.

Figure 2E:
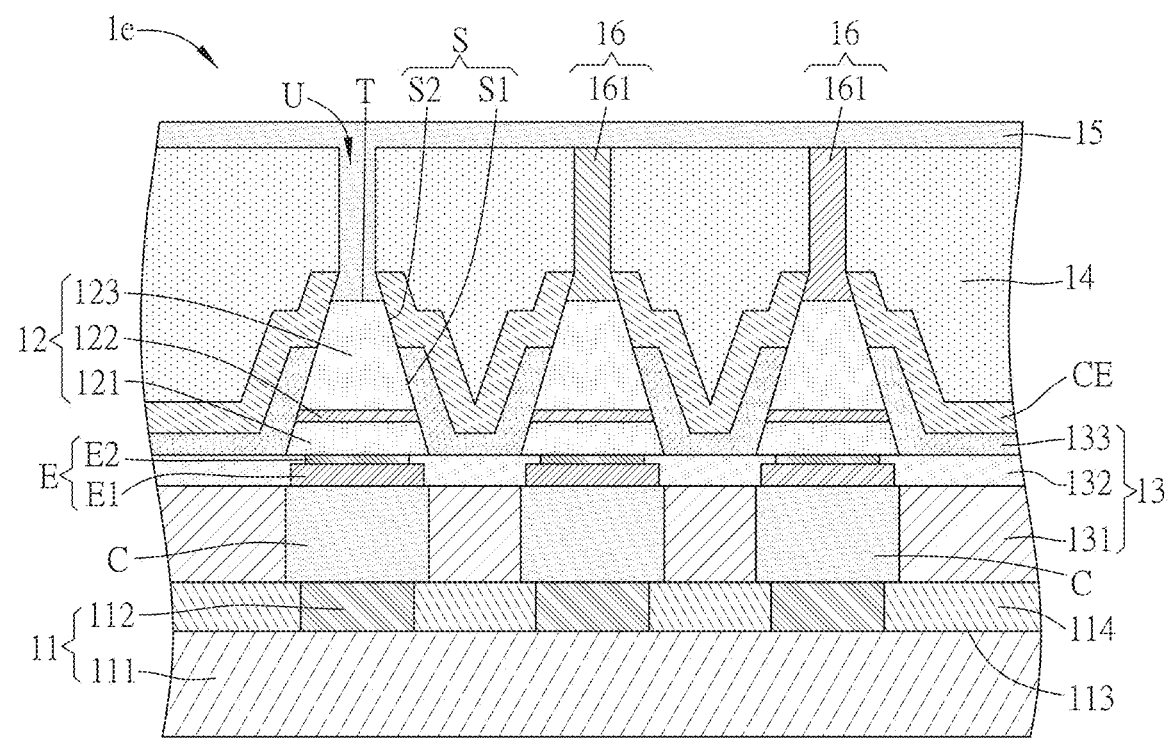

As shown in FIG. 2E, the configurations and connections of the components in the LED micro display device 1e of this embodiment are mostly the same as those of the LED micro display device 1 of the above-mentioned embodiment. Unlike the above-mentioned embodiment, the LED micro display device 1e of this embodiment further comprises a planarization layer 14, a protection layer 15 and a light conversion layer 16. The common electrode layer CE is disposed higher than the top surface T (with exposing the top surface T), and the planarization layer 14 is disposed on the common electrode layer CE. The planarization layer 14, the common electrode layer CE, and the top surfaces T of the micro light-emitting elements 12 together define a plurality of recesses U. The light conversion layer 16 is disposed in at least a part of the recesses U. In this embodiment, the light conversion layer 16 is disposed in a part of the recesses U, which are not filled with the protection layer 15. In addition, the protection layer 15 is disposed on the planarization layer 14 and the light conversion layer 16, and is filled in at least a part of the recesses U. For example, the protection layer 15 can be filled in the recess U in one sub-pixel of one pixel. In this embodiment, the material of the protection layer 15 is filled in the recess U in one of three sub-pixels of each pixel, and the light conversion layer 16 is filled in the other two recesses U in each pixel, which are not filled with the protection layer 15. The light conversion layer 16 can comprise a light conversion material, such as quantum dot (QD), phosphorescent material, or fluorescent material. The light conversion material of this embodiment includes quantum dots (forming a quantum dot layer 161) as an example. To be noted, in different embodiments, the light conversion layer 16 may not be provided, and the protection layer 15 is filled in all of the recesses U.

In this embodiment, the micro light-emitting elements 12 can be, for example, blue-light μLEDs for emitting blue light, and the two recesses U in the sub-pixels of a pixel P, which are not filled with light conversion materials, can be filled with quantum dots of different sizes. When the blue light is irradiated on the quantum dots of different sizes, the light can be excited to produce green light and red light, thereby forming a full-color LED micro display device. In some embodiments, the thickness of the quantum dot layer 161 can be, for example, between 4 μm and 8 μm.

Figure 2F:
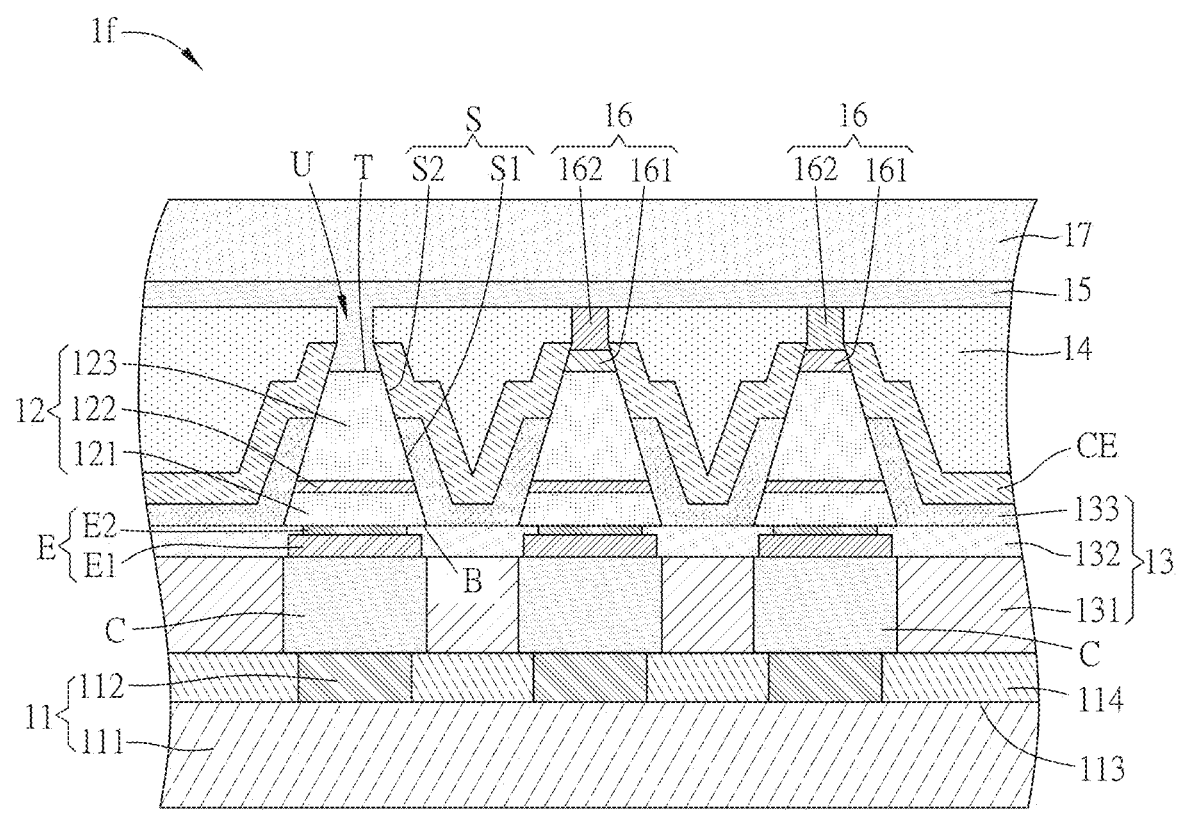
Figure 2G:
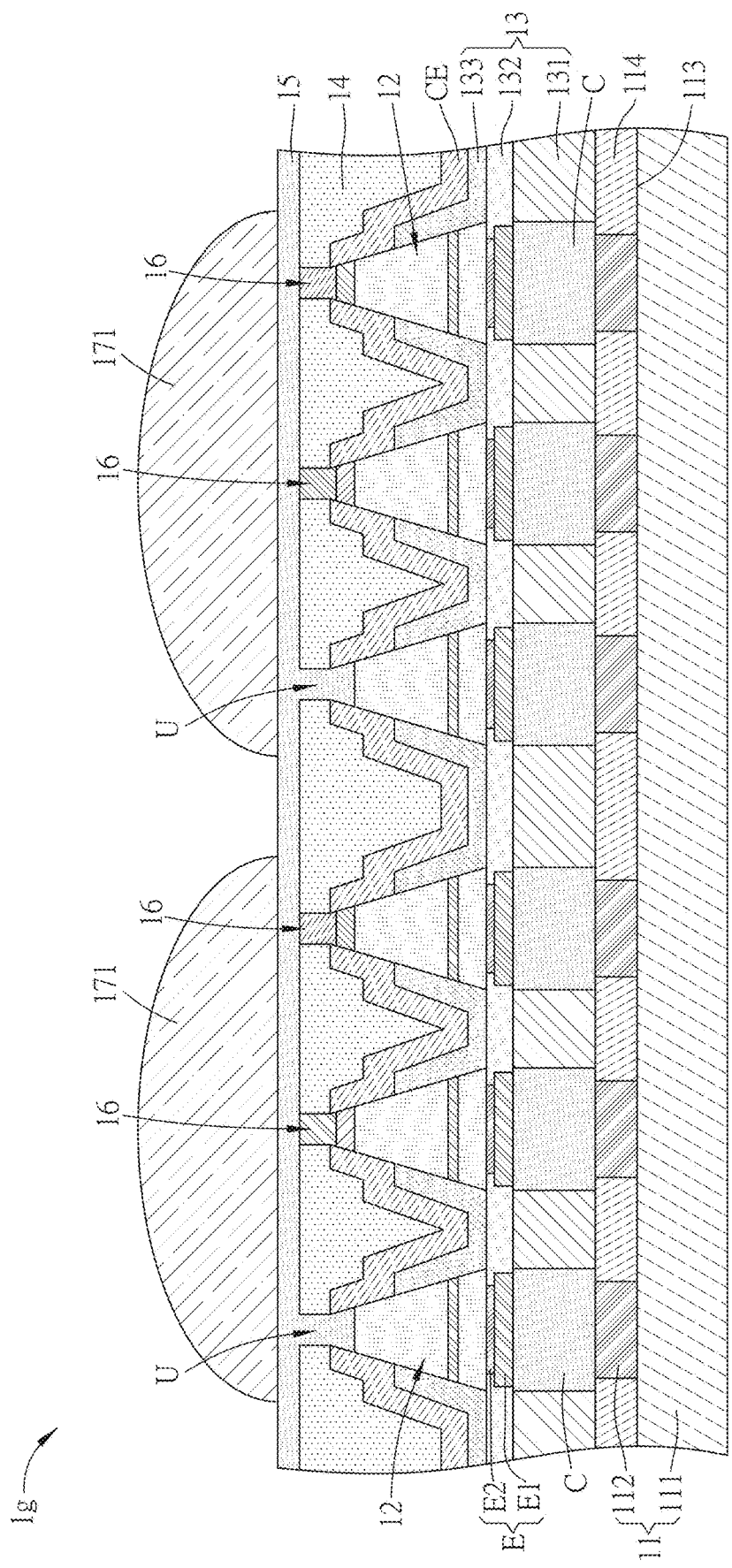
Figure 2H:
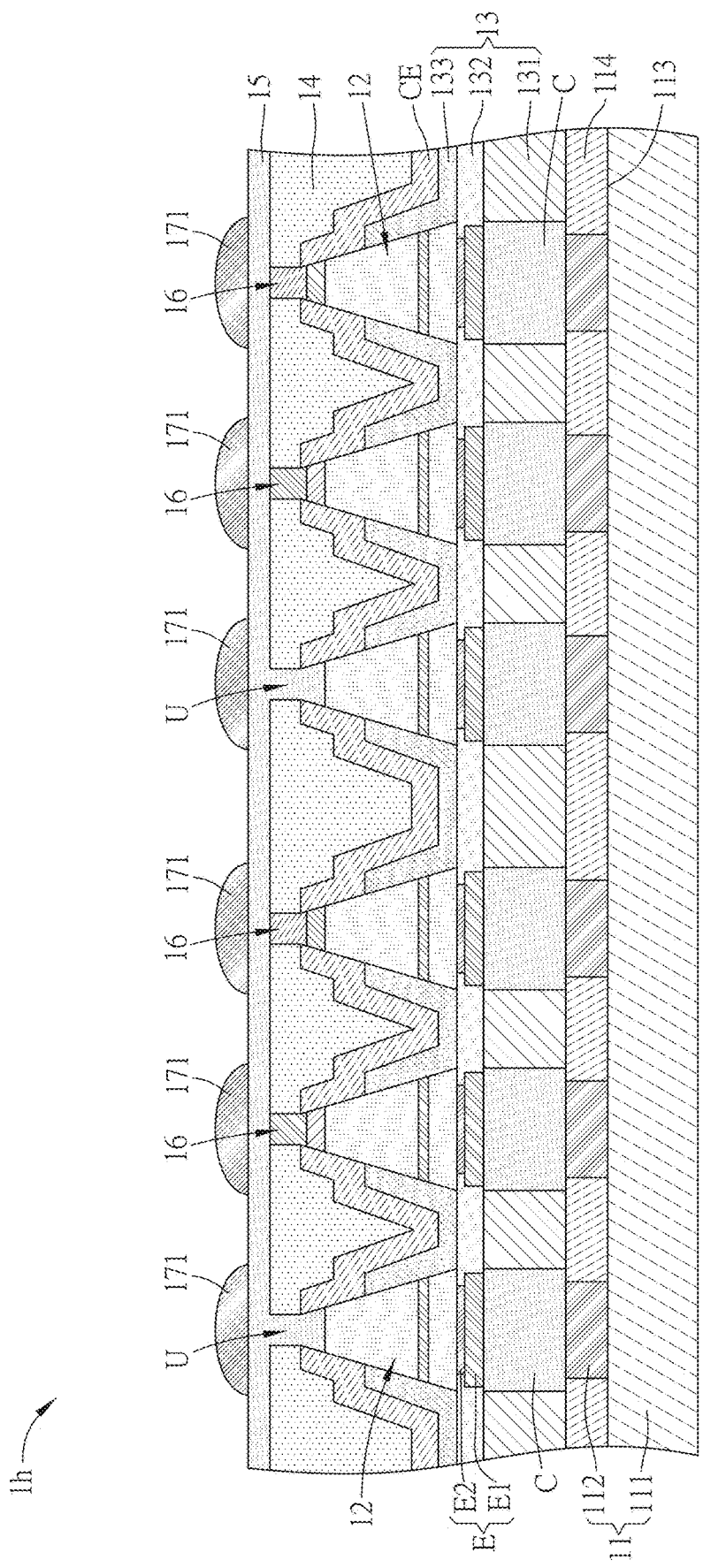

As shown in FIG. 2F, the configurations and connections of the components in the LED micro display device 1f of this embodiment are mostly the same as those of the LED micro display device 1e of the previous embodiment. Unlike the previous embodiment, in the LED micro display device 1f of this embodiment, the light conversion layer 16 comprises, for example, a light conversion material (forming the quantum dot layer 161) and a light filter material (forming a light filter layer 162 located between the quantum dot layer 161 and the top surface T). In this embodiment, the micro light-emitting elements 12 can be, for example, blue-light μLEDs for emitting blue light, and the quantum dots of different sizes disposed in the three sub-pixels of a pixel P can excite the blue light to produce green light and red light, thereby, cooperating with the green and red color filter materials, forming a full-color LED micro display device. In this embodiment, the light filter material (the light filter layer 162) is configured to prevent the unconverted blue light from being emitted upwardly and outwardly, so that the color purity of the outputted light can be improved. In other embodiments, the blue filter material can be formed in the blue sub-pixel for enhancing the wavelength uniformity.

In addition, the LED micro display device 1f of this embodiment can further comprise a light permeable layer 17, which is disposed on the protection layer 15. The light permeable layer 17 can comprise a light concentration structure or an adhesion material. In this embodiment, the light permeable layer 17 is, for example, an optical clear adhesive (OCA).

To sum up, in the LED micro display device of this disclosure, the micro light-emitting elements are disposed corresponding to the conductive patterns of the circuit substrate, the insulating layer covers the first sidewall portions of the micro light-emitting elements, and the common electrode layer is electrically connected to the micro light-emitting elements and contacts the second sidewall portions of the micro light-emitting elements with exposing the top surfaces of the micro light-emitting elements. Accordingly, the light emitted from the top surface of the micro light-emitting element is not blocked or absorbed by the common electrode layer. As a result, the LED micro display device of this disclosure can have a good luminous efficiency for meeting the requirement of high-resolution display devices.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A light-emitting diode micro display device, comprising:
    a circuit substrate having a plurality of conductive patterns;
    a plurality of micro light-emitting elements bonded to the circuit substrate and disposed corresponding to the conductive patterns, wherein each of the micro light-emitting elements has a bottom surface, a top surface and a side wall connected to the bottom surface and the top surface, the bottom surface connects to the corresponding conductive pattern, the side wall has a first sidewall portion and a second sidewall portion connected to the first sidewall portion, and the first sidewall portion is disposed adjacent to the circuit substrate, while the second sidewall portion is disposed away from the circuit substrate;
    an insulating layer disposed on the circuit substrate, covering the first sidewall portions and exposing the second sidewall portions;
    a common electrode layer disposed on the circuit substrate and covering the insulating layer and the second sidewall portions of the plurality of micro light-emitting elements, wherein the common electrode layer is electrically connected to the micro light-emitting elements;
    a planarization layer disposed on the common electrode layer, wherein the planarization layer, the common electrode layer, and the top surfaces of the micro light-emitting elements together define a plurality of recesses;
    a light conversion layer disposed in at least a part of the recesses; and
    a protection layer disposed on and completely covering the planarization layer and the light conversion layer,
    wherein, the common electrode layer contacts the second sidewall portions and exposes the top surface of each of the micro light-emitting elements.

2. The light-emitting diode micro display device of claim 1, wherein an aspect ratio of the micro light-emitting element is greater than or equal to 0.5 and less than or equal to 2.5.

3. The light-emitting diode micro display device of claim 1, wherein the micro light-emitting element comprises a first type semiconductor layer, a light-emitting layer and a second type semiconductor layer stacked in order, and the first type semiconductor layer is adjacent to the circuit substrate and electrically connected to the corresponding conductive pattern.

4. The light-emitting diode micro display device of claim 3, wherein the insulating layer cover a side surface of the light-emitting layer and a side surface of the first type semiconductor layer.

5. The light-emitting diode micro display device of claim 1, further comprising:
    a plurality of bonding electrodes disposed corresponding to the micro light-emitting elements, respectively; and
    a plurality of conductive members disposed corresponding between the bonding electrodes and the conductive patterns, wherein each of the micro light-emitting elements is bonded on the circuit substrate via the corresponding bonding electrode and the corresponding conductive member, and electrically connected to the corresponding conductive pattern.

6. The light-emitting diode micro display device of claim 5, wherein a width of the conductive member is greater than the corresponding conductive pattern, and is less than or equal to a width of the corresponding micro light-emitting element.

7. The light-emitting diode micro display device of claim 5, wherein the bonding electrode is arranged on the bottom surface of the micro light-emitting element in an indentation manner.

8. The light-emitting diode micro display device of claim 5, wherein the bonding electrode comprises a metal layer, a transparent conductive layer, or a combination thereof.

9. The light-emitting diode micro display device of claim 5, wherein the insulating layer comprises a first insulating layer, a second insulating layer and a third insulating layer overlapped with each other, the first insulating layer is disposed between the conductive members, the second insulating layer is disposed between the first insulating layer and the third insulating layer, and the third insulating layer is disposed between the sidewall portion and the common electrode layer.

10. The light-emitting diode micro display device of claim 1, wherein the protection layer is filled into at least a part of the recesses.

11. The light-emitting diode micro display device of claim 1, wherein the light conversion layer comprises a light conversion material and a light filter material.

12. The light-emitting diode micro display device of claim 1, further comprising:
a light permeable layer disposed on the protection layer.

13. The light-emitting diode micro display device of claim 12, wherein the light permeable layer comprises a light concentration structure or an adhesion material.

14. The light-emitting diode micro display device of claim 12, wherein the light permeable layer comprises a plurality of light concentration structures, and the light concentration structures are arranged corresponding to a plurality of pixels, respectively.

15. The light-emitting diode micro display device of claim 12, wherein the light permeable layer comprises a plurality of light concentration structures, and the light concentration structures are arranged corresponding to the micro light-emitting elements, respectively.

16. A light-emitting diode micro display device, comprising:
a circuit substrate having a plurality of conductive patterns;
a plurality of micro light-emitting elements bonded to the circuit substrate and disposed corresponding to the conductive patterns, wherein each of the micro light-emitting elements has a bottom surface, a top surface and a side wall connected to the bottom surface and the top surface, the bottom surface connects to the corresponding conductive pattern, the side wall has a first sidewall portion and a second sidewall portion connected to the first sidewall portion, and the first sidewall portion is disposed adjacent to the circuit substrate, while the second sidewall portion is disposed away from the circuit substrate;
an insulating layer disposed on the circuit substrate, covering the first sidewall portions and exposing the second sidewall portions;
a common electrode layer disposed on the circuit substrate and covering the insulating layer and the second sidewall portions of the plurality of micro light-emitting elements, wherein the common electrode layer is electrically connected to the micro light-emitting elements;
a planarization layer disposed on the common electrode layer; and
a protection layer disposed on and completely covering the planarization layer and the micro light-emitting elements,
wherein, the common electrode layer contacts the second sidewall portions and exposes the top surface of each of the micro light-emitting elements.

17. The light-emitting diode micro display device of claim 16, wherein the micro light-emitting element comprises a first type semiconductor layer, a light-emitting layer and a second type semiconductor layer stacked in order, and the first type semiconductor layer is adjacent to the circuit substrate and electrically connected to the corresponding conductive pattern, the insulating layer cover a side surface of the light-emitting layer and a side surface of the first type semiconductor layer.

18. The light-emitting diode micro display device of claim 16, further comprising:
a plurality of bonding electrodes disposed corresponding to the micro light-emitting elements, respectively, the bonding electrode is arranged on the bottom surface of the micro light-emitting element in an indentation manner.

19. The light-emitting diode micro display device of claim 16, further comprising:
a light permeable layer disposed on the protection layer.

20. The light-emitting diode micro display device of claim 19, wherein the light permeable layer comprises a plurality of light concentration structures, and the light concentration structures are arranged corresponding to the micro light-emitting elements, respectively.

* * * * *